United States Patent
Xiu (10) Patent No.: US 8,258,834 B2
(45) Date of Patent: Sep. 4, 2012

(54) LOCK DETECTOR, METHOD APPLICABLE THERETO, AND PHASE LOCK LOOP APPLYING THE SAME

(75) Inventor: Liming Xiu, Plano, TX (US)

(73) Assignee: Novatek Microelectronics Corp., Hsinchu (TW)

( * ) Notice: Subject to any disclaimer, the term of this patent is extended or adjusted under 35 U.S.C. 154(b) by 105 days.

(21) Appl. No.: 12/889,524

(22) Filed: Sep. 24, 2010

(65) Prior Publication Data
US 2011/0254601 A1    Oct. 20, 2011

(30) Foreign Application Priority Data
Apr. 16, 2010    (TW) .............................. 99112065 A (51) Int. Cl.
*H03L 7/06* (2006.01)
(52) U.S. Cl. .................. 327/156; 327/147; 327/157
(58) Field of Classification Search .......... 327/147, 327/156, 157
See application file for complete search history.

(56) References Cited

U.S. PATENT DOCUMENTS

| | | | | |
|---|---|---|---|---|
| 5,008,635 A | * | 4/1991 | Hanke et al. | 331/1 A |
| 5,189,379 A | * | 2/1993 | Saito et al. | 331/1 A |
| 5,327,103 A | * | 7/1994 | Baron et al. | 331/1 A |
| 6,239,632 B1 | | 5/2001 | Moyal et al. | |
| 6,744,838 B1 | * | 6/2004 | Dixit | 375/373 |
| 7,183,861 B2 | * | 2/2007 | Jung | 331/1 A |
| 7,424,082 B2 | * | 9/2008 | Choi | 375/371 |
| 8,040,156 B2 | * | 10/2011 | Lee et al. | 327/20 |
| 8,067,968 B2 | * | 11/2011 | Shin et al. | 327/158 |
| 2002/0175769 A1 | * | 11/2002 | Wong et al. | 331/17 |
| 2011/0227616 A1 | * | 9/2011 | Jang et al. | 327/157 |
| 2011/0254601 A1 | * | 10/2011 | Xiu | 327/157 |

FOREIGN PATENT DOCUMENTS

| CN | 1794044 A | 6/2006 |
|---|---|---|
| CN | 101588177 A | 11/2009 |

* cited by examiner

*Primary Examiner* — Adam Houston
(74) *Attorney, Agent, or Firm* — Rabin & Berdo, P.C.

(57) ABSTRACT

A lock detector for a phase lock loop (PLL) includes: first and second pulse width extenders, performing pulse width extension on first and second pulses for generating third and fourth pulses, respectively; first and second delay circuits, delaying the third and the fourth pulses into first and second sampling clocks, respectively; and a cross-sampling circuit, sampling the third pulse based on the second sampling clock and sampling the fourth pulse based on the first sampling clock to indicate whether the PLL is locked.

15 Claims, 6 Drawing Sheets

FIG. 10 ical field

The disclosure relates in general to a lock detector, a method thereof and a phase lock loop (PLL) applying the same, and more particularly to a lock detector and a method thereof capable of indicating whether the phase lock loop is locked and a phase lock loop applying the same.

BACKGROUND

Phase lock loop is indispensable in a pulse generator. The phase lock loop, capable of precisely controlling pulse or frequency, can be used in frequency modulation for wireless signals or clock control for digital products to simplify the complexity and increase the precision of circuit.

In a conventional phase lock loop, an analog lock detector is used to indicate the state of the phase lock loop, that is, whether the phase lock loop is in a lock state or an unlock state. Since the analog lock detector occupies a large circuit area and consumes a large amount of power, the digital lock detector is thus provided. However, neither the analog lock detector nor the digital lock detector precisely defines the lock state.

BRIEF SUMMARY

The full digital lock detector disclosed in the embodiments of the disclosure can precisely define the lock state, that is, quantitatively and qualitatively define the lock state and further dynamically design the lock state.

According to a first example of the present disclosure, a lock detector for phase lock loop (PLL) is provided. The lock detector includes a first pulse width extender and a second pulse width extender for performing pulse extension on a first pulse and a second pulse to generate a third pulse and a fourth pulse, respectively; a first delay circuit and a second delay circuit for delaying the third pulse and the fourth pulse into a first sampling clock and a second sampling clock, respectively; and a cross-sampling circuit for sampling the third pulse according to the second sampling clock and for sampling the fourth pulse according to the first sampling clock to indicate whether the phase lock loop is in a lock state.

According to a second example of the present disclosure, a phase lock loop is provided. The phase lock loop includes a phase/frequency detector for comparing and detecting a reference clock and an output clock to output a first pulse and a second pulse; a lock detector coupled to the phase/frequency detector for sampling the second pulse according to the first pulse and for sampling the first pulse according to the second pulse to indicate whether the phase lock loop is locked; a charge pump coupled to the phase/frequency detector for converting the first and the second pulse into a control voltage; and a voltage controlled oscillator coupled to the charge pump for generating the output clock according to the control voltage.

According to a third example of the present disclosure, a lock detecting method, for detecting whether an output clock is locked to a reference clock, includes: comparing and detecting the reference clock and the output clock to output a first pulse and a second pulse; extending a pulse width of the first pulse to generate a third pulse; extending a pulse width of the second pulse to generate a fourth pulse; delaying the third pulse into a first sampling clock; delaying the fourth pulse into a second sampling clock; and sampling the third pulse according to the second sampling clock and sampling the fourth pulse according to the first sampling clock to indicate whether the output clock is locked to the reference clock.

It is to be understood that both the foregoing general description and the following detailed description are exemplary and explanatory only and are not restrictive of the disclosed embodiments, as claimed.

DETAILED DESCRIPTION OF EXEMPLARY EMBODIMENT OF THE PRESENT DISCLOSURE

Figure 1:
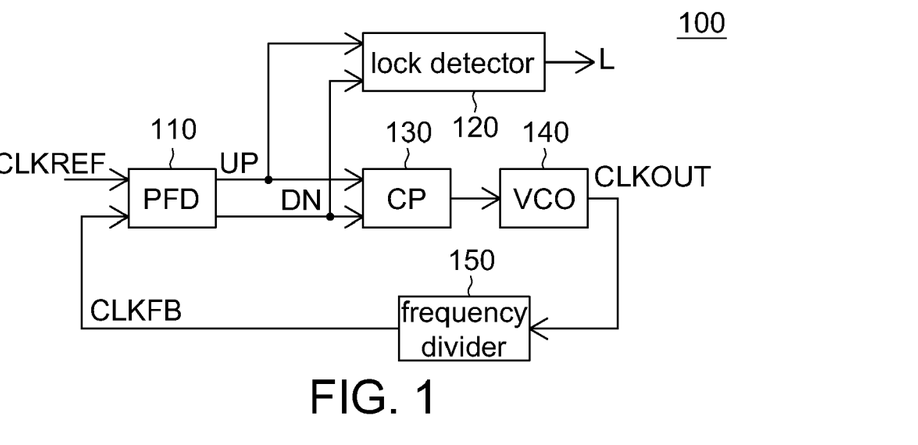
FIG. 1 shows a functional block diagram of a phase lock loop according to an embodiment of the disclosure.

Referring to FIG. 1, a functional block diagram of a phase lock loop according to an embodiment of the disclosure is shown. As indicated in FIG. 1, the phase lock loop 100 includes a phase/frequency detector (PFD) 110, a lock detector 120, a charge pump 130, a voltage controlled oscillator (VCO) 140 and a frequency divider 150.

The phase/frequency detector 110 compares the reference clock CLKREF and the feedback clock CLKFB to detect their phase difference and their frequency difference. When the frequency of the reference clock CLKREF is higher than the frequency of the feedback clock CLKFB, the phase/frequency detector outputs an UP pulse. To the contrary, when the frequency of the reference clock CLKREF is lower than the frequency of the feedback clock CLKFB, the phase/frequency detector outputs a DN pulse. The pulses UP/DN generated by the phase/frequency detector 110 are converted into a control voltage through the charge pump 130 (also known as a current controller). The control voltage controls the voltage controlled oscillator 140 to generate an output clock CLK-OUT.

If the output clock CLKOUT directly functions as the feedback clock CLKFB (not through the frequency divider), then the phase lock loop is a PLL for locking phase; and the output clock CLKOUT locks the reference clock CLKREF, so that the phase and the frequency of the output clock CLKOUT and the reference clock CLKREF are synchronous.

On the contrary, after divided by the frequency divider 150, the output clock CLKOUT functions as the feedback clock CLKFB. When the PLL is in a stable lock state, the frequency and the phase at two inputs of the phase/frequency detector should be equal, that is, CLKOUT/M=CLKREF, wherein M is the frequency division parameter for the frequency divider.

Figure 2:
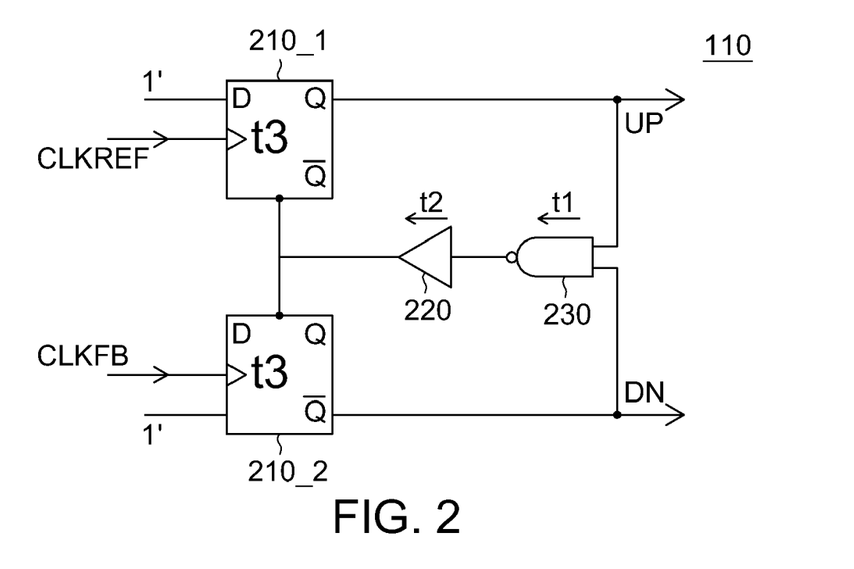
FIG. 2 shows a functional block diagram of a phase/frequency detector according to the embodiment of the disclosure.
Figure 3:
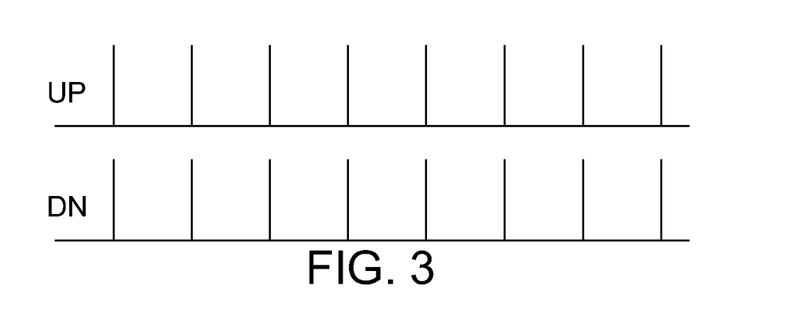
FIG. 3 shows wave forms of pulses UP and DN when the reference clock CLKREF and the feedback clock CLKFB are in phase alignment and frequency alignment according to the embodiment of the disclosure.

FIG. 2 shows a functional block diagram of the phase/frequency detector 110 according to the embodiment of the disclosure. As indicated in FIG. 2, the phase/frequency detector 110 includes flip-flops (FF) 210_1 and 210_2, a delay unit 220 and a NAND gate 230. The delay time parameter of the NAND gate 230 is t1; the delay time parameter of the delay unit 220 is t2; and the delay time parameters of the flip-flops 210_1 and 210_2 are both t3. FIG. 3 shows wave forms of pulses UP and DN when the reference clock CLKREF and the feedback clock CLKFB are in phase alignment and frequency alignment.

Figure 4:
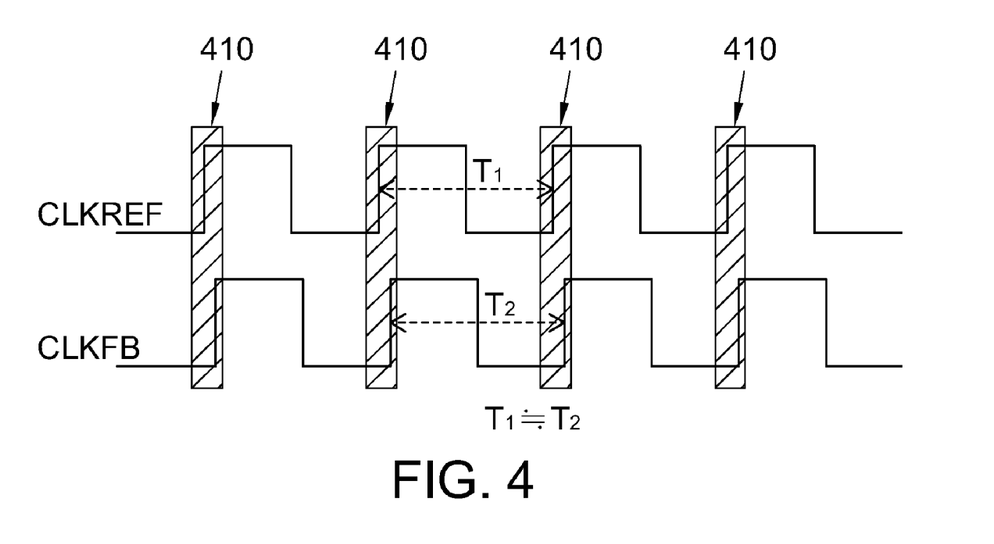
FIG. 4 shows an enlarged wave forms of the reference clock CLKREF and the feedback clock CLKFB in an alignment state according to the embodiment of the disclosure.

FIG. 4 shows an enlarged wave form of the reference clock CLKREF and the feedback clock CLKFB in an alignment state according to the embodiment of the disclosure. As indicated in FIG. 4, given that (1) the occurrence timing of the ascending/descending edge of the reference clock CLKREF is close to that of the ascending/descending edge of the feedback clock CLKFB and that (2) the frequency of the reference clock CLKREF is approximate equal to the frequency of the feedback clock CLKFB (that is, T1≈T2), the reference clock CLKREF and the feedback clock CLKFB are regarded as in an alignment state.

Despite the reference clock CLKREF and the feedback clock CLKFB are regarded as in an alignment state, the occurrence timing of the ascending/descending edge of the reference clock CLKREF and that of the feedback clock CLKFB still fall within the uncertainty range as indicated by the designation 410 of FIG. 4. The uncertainty range may be affected by many factors of the circuits in practical application. Thus, in the present embodiment of the disclosure, the locked state is definitely defined by the lock detector 120 to avoid being affected by negative factors.

Figure 5A:
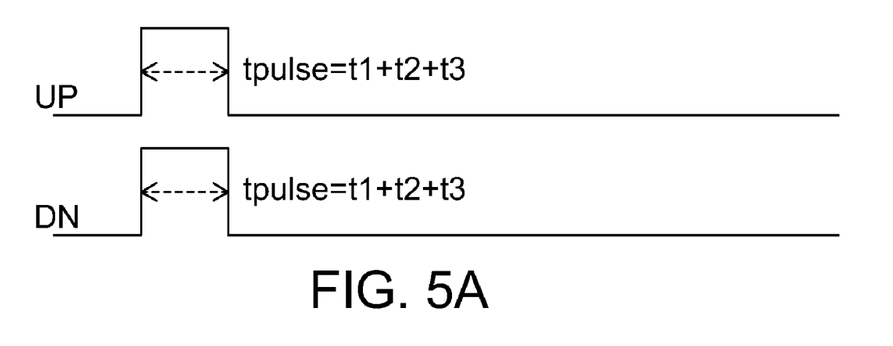
FIG. 5A shows a wave form of pulses UP/DN in an alignment state according to the embodiment of the disclosure.
Figure 5B:
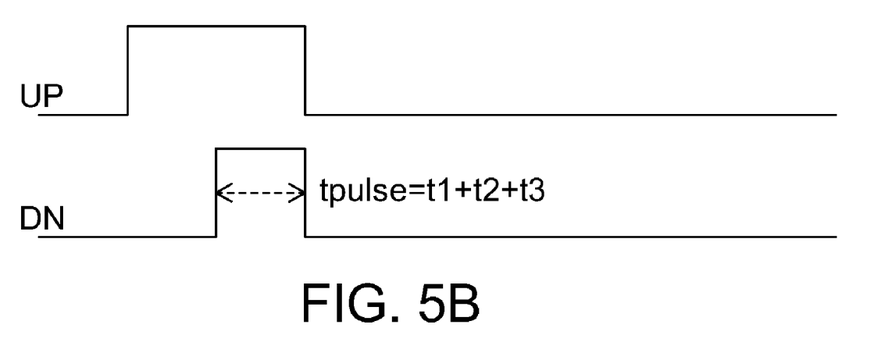
FIG. 5B shows a wave form of pulses UP/DN in a non-alignment state (the feedback clock CLKFB is behind) according to the embodiment of the disclosure.
Figure 5C:
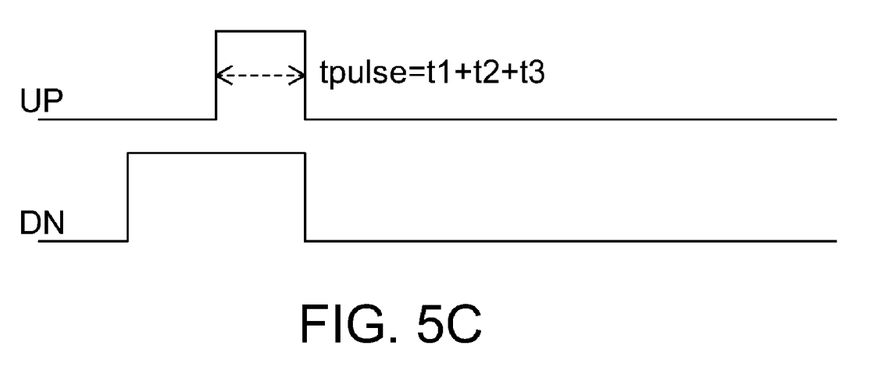
FIG. 5C shows a wave form of pulses UP/DN in a non-alignment state (the feedback clock CLKFB is ahead) according to the embodiment of the disclosure.

FIG. 5A shows wave forms of pulses UP/DN in an alignment state according to the embodiment of the disclosure. Under such state as indicated in FIG. 5A, the pulse width of the pulse UP is substantially equal to that of the pulse DN (tpulse=t1+t2+t3). FIG. 5B shows wave forms of pulses UP/DN in a non-alignment state (the feedback clock CLKFB is behind) according to the embodiment of the disclosure. Under such state as indicated in FIG. 5B, the pulse width tpulse of the pulse UP is substantially not equal to that of the pulse DN. FIG. 5C shows wave forms of pulses UP/DN in a non-alignment state (the feedback clock CLKFB is ahead) according to the embodiment of the disclosure. Under such state as indicated in FIG. 5C, the pulse width tpulse of the pulse UP is substantially not equal to that of the pulse DN.

Here, "alignment" is a qualitative definition which defines the frequency and the phase of two signals (such as CLKREF and CLKFB) are close to each other, but "lock" is a quantitative analysis which definitively specifies the range of the phase difference between two signals.

In the present embodiment of the disclosure, the lock detector 120 regards the pulse UP as a sampling clock and a data to be sampled, and regards the pulse DN as a sampling clock and a data to be sampled. Furthermore, the lock detector 120 samples the pulse UP according to the pulse DN and samples the pulse DN according to the pulse UP.

Figure 6:
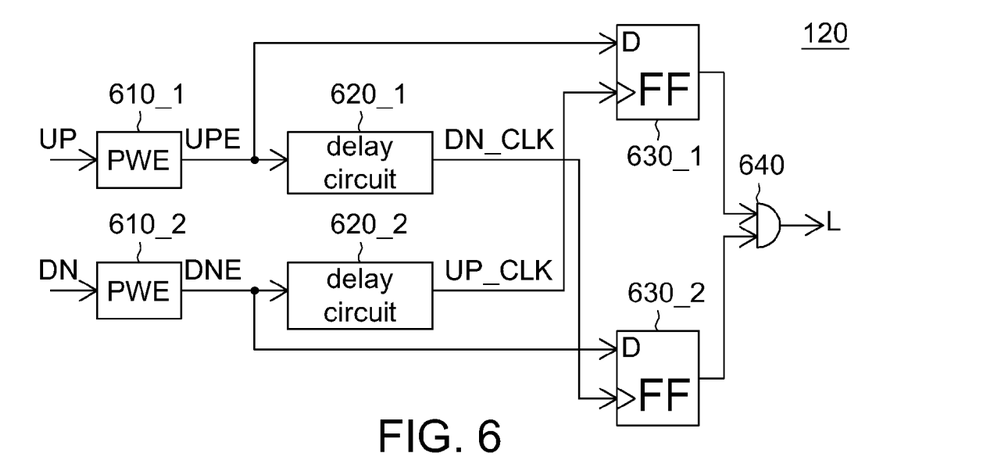
FIG. 6 shows a functional block diagram of a lock detector according to the embodiment of the disclosure.

FIG. 6 shows a functional block diagram of the lock detector according to the embodiment of the disclosure. As indicated in FIG. 6, the lock detector 120 includes pulse width extenders 610_1 and 610_2, delay circuits 620_1 and 620_2, flip-flops 630_1 and 630_2 and a logic gate 640. To detect whether the PLL is locked, the lock detector 120 extends the pulse widths of the pulses UP and DN and further delays and cross-samples the pulses UP and DN. The details of the lock detector 120 are disclosed below. The logic gate 640 is for example an AND logic gate.

Figure 7A:
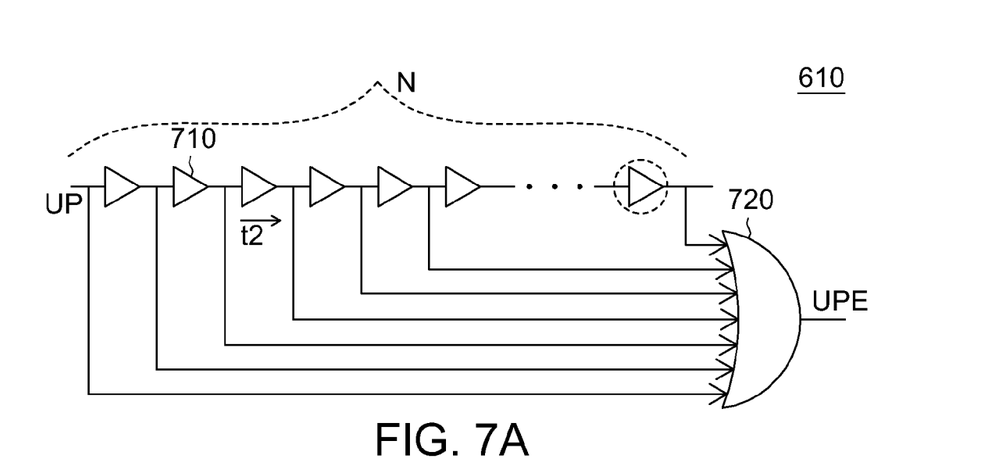
FIG. 7A shows an example of a pulse width extender according to the embodiment of the disclosure.

FIG. 7A shows an example of THE pulse width extender 610 according to THE embodiment of the disclosure. As indicated in FIG. 7A, the pulse width extender 610 includes N delay units 710 and a logic gate 720. The delay unit 710 of FIG. 7A and the delay unit 220 of FIG. 2 have the same delay time parameter t2. The logic gate 720 is for example a logic OR gate. The pulse width extender 610 implements the pulse width extenders 610_1 and 610_2 of FIG. 6.

Figure 7B:
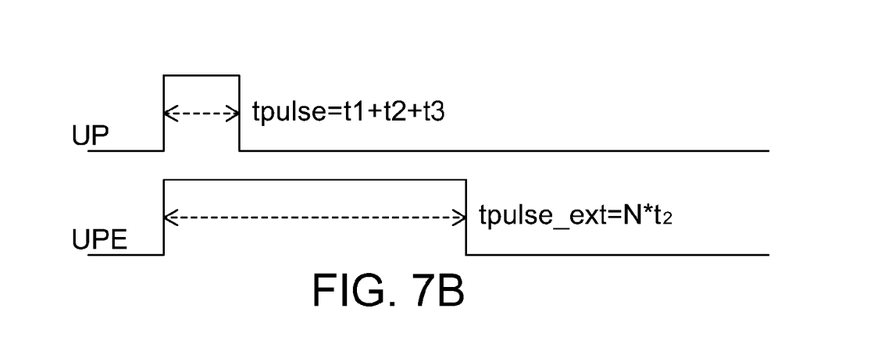
FIG. 7B shows wave forms of pulses UP and UPE (after pulse extension) according to the embodiment of the disclosure.

FIG. 7B shows wave forms of pulses UP and UPE (after pulse extension) according to the embodiment of the disclosure. As indicated in FIGS. 7A and 7B, the original pulse width of the pulse UP is t1+t2+t3, but after pulse extension, the pulse width of the pulse UPE is Nt2, and the pulse UPE does not have any glitch for the following reasons: Firstly, the pulse width of the pulse UP is t1+t2+t3. Secondly, the delay time for each delay unit is the same, that is, t2. Thirdly, the logic OR operation is performed on the output signals of these delay units. To be free of glitch is very important to the pulse UPE/DNE. The purposes of the pulse width extender 610 include: firstly, making the pulse width Nt2 of the output clock UPE become known (both N and t2 are known); and secondly, latching of the pulses UPE and DNE by the flip-flop FF is more accurate because the pulses UPE and DNE have wider pulse width than the original pulses UP and DN.

Figure 8:
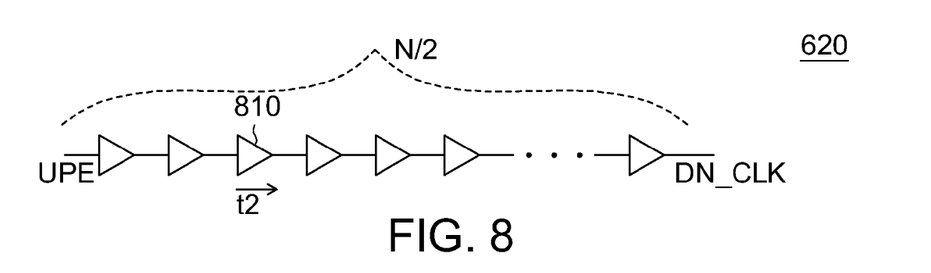
FIG. 8 shows an example of a delay circuit according to the embodiment of the disclosure.
Figure 9:
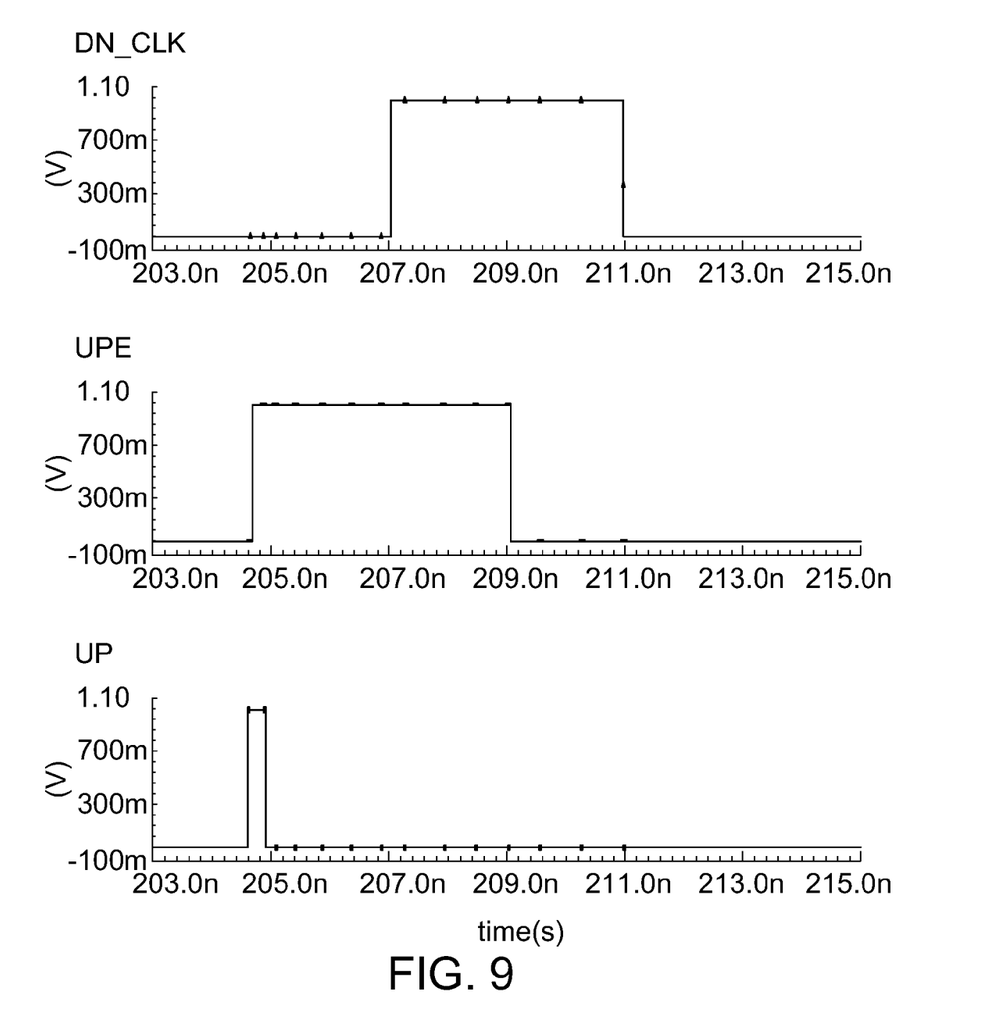
FIG. 9 shows an example of pulses UP and UPE and the sampling clock signal DN_CLK according to the embodiment of the disclosure.

FIG. 8 shows an example of the delay circuit 620 according to the present embodiment of the disclosure. The delay circuit 620 for example implements the delay circuits 620_1 and 620_2 of FIG. 6. As indicated in FIG. 8, the delay circuit 620 includes N/2 delay units 810. The delay unit 810 of FIG. 8 and the delay unit 220 of FIG. 2 have the same delay time parameter t2. The delay circuit 620_1 delays the pulse UPE into a sampling clock signal DN_CLK for sampling the pulse DN (to be more precisely, for sampling the pulse DNE). FIG. 9 shows an example of the pulses UP and UPE and the sampling clock signal DN_CLK according to the embodiment of the disclosure.

As indicated in FIG. 6, when the flip-flop 630_1 and 630_2 both output logic 1, the lock signal L becomes logic 1. When the lock signal L is logic 1, this implies that the PLL is already in a lock state.

Figure 10:
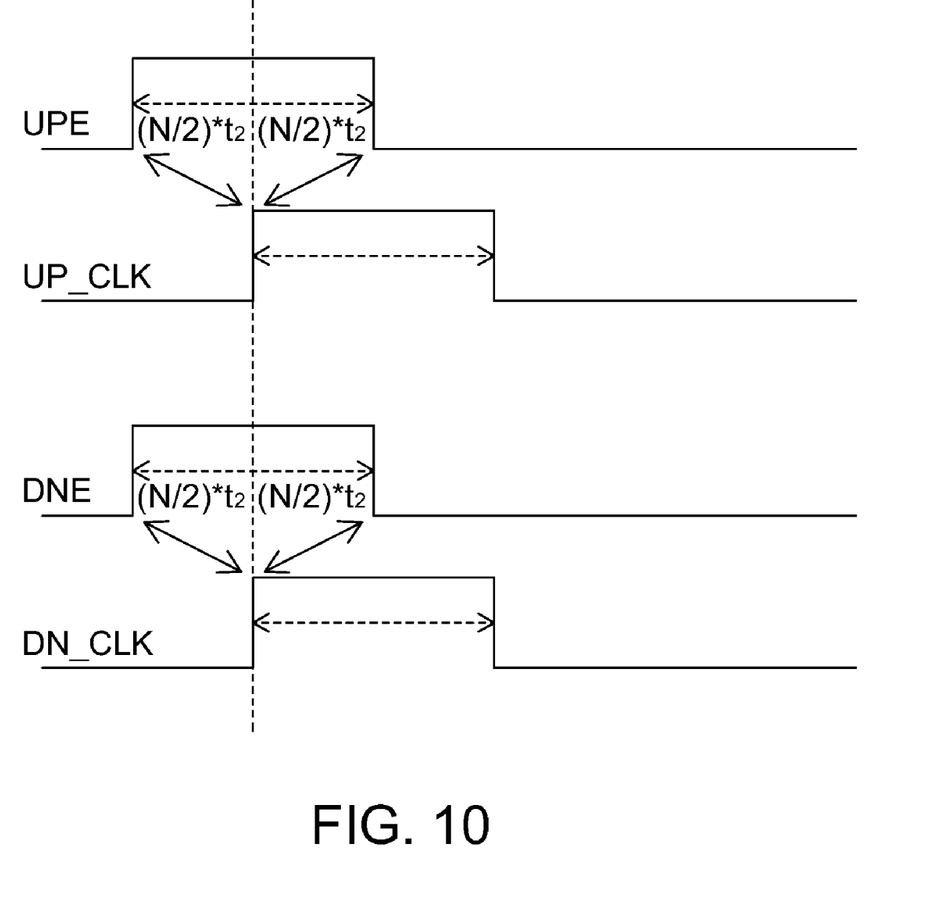
FIG. 10 shows a wave form when PLL is in a lock state according to the embodiment of the disclosure.

FIG. 10 shows a signal wave when PLL is in a lock state. The upper part of the FIG. 10 illustrates the situation when the flip-flop 630_1 outputs logic 1, and the lower part of the FIG. 10 illustrates the situation when the flip-flop 630_2 outputs logic 1. Furthermore, when the time difference between the rising edge (or the falling edge) of the pulse UP and the rising edge (or the falling edge) of the pulse DN is smaller than (N/2)*t2, this implies that the PLL is in a lock state. To the contrary, when the time difference between the rising edge (or the falling edge) of the pulse UP and the rising edge (or the falling edge) of the pulse DN is larger than (N/2)*t2, this implies that the PLL is not yet in a lock state. In the embodiments of the disclosure, when the time difference between the rising edge (or the falling edge) of the reference clock CLKREF and the rising edge (or the falling edge) of the feedback clock CLKFB is smaller than (N/2)*t2, this implies that the PLL is in a lock state. Thus, the embodiment of the disclosure not only qualitatively defines the "lock state" but also quantitatively defines the "lock state".

In the embodiments of the disclosure, the lock state can be dynamically adjusted to fit actual needs by changing the value of N. That is, in the embodiment of the disclosure, the sensitivity of the lock detector can be adjusted by changing the value of N. As the value of N becomes smaller, the sensitivity of the lock detector becomes higher. This is because the time difference between the rising edge (or the falling edge) of the reference clock CLKREF and the rising edge (or the falling edge) of the feedback clock CLKFB must be very small for enabling the lock detector to be in a lock state, and vice versa.

The full digital lock detector and the phase lock loop applying the same disclosed in the embodiment of the disclosure have many advantages exemplified below.

The full digital lock detector disclosed in the above embodiments of the disclosure can precisely define the lock state and dynamically design the lock state. In addition, the full digital lock detector disclosed in the above embodiments of the disclosure occupies small circuit area and has low power consumption, and the sensitivity of the lock detector can be dynamically designed to fit actual needs.

It will be appreciated by those skilled in the art that changes could be made to the disclosed embodiments described above without departing from the broad inventive concept thereof. It is understood, therefore, that the disclosed embodiments are not limited to the particular examples disclosed, but is intended to cover modifications within the spirit and scope of the disclosed embodiments as defined by the claims that follow.

What is claimed is:

1. A state detector applied in a phase lock loop, comprising:
    a first pulse width extender and a second pulse width extender for performing pulse extension on a first pulse and a second pulse to generate a third pulse and a fourth pulse, respectively;
    a first delay circuit and a second delay circuit for delaying the third pulse and the fourth pulse into a first sampling clock and a second sampling clock, respectively; and
    a cross-sampling circuit for sampling the third pulse according to the second sampling clock and for sampling the fourth pulse according to the first sampling clock to indicate whether the phase lock loop is in a lock state.

2. The state detector according to claim 1, wherein pulse widths of the third pulse and the fourth pulse are known.

3. The state detector according to claim 2, wherein:
    the first delay circuit delays the third pulse by a half of the pulse width of the third pulse; and
    the second delay circuit delays the fourth pulse by a half of the pulse width of the fourth pulse.

4. The state detector according to claim 2, wherein the cross-sampling circuit comprises:
    a first flip-flop circuit for sampling the third pulse according to the second sampling clock;
    a second flip-flop circuit for sampling the fourth pulse according to the first sampling clock; and
    a logic circuit for receiving outputs from the first flip-flop circuit and the second flip-flop circuit, wherein an output of the logic circuit indicates whether the phase lock loop is in the lock state.

5. The state detector according to claim 2, wherein when a phase difference between the first pulse and the second pulse is smaller than a half of the pulse width of the third pulse or smaller than a half of the pulse width of the fourth pulse, the cross-sampling circuit indicates that the phase lock loop is in the lock state.

6. A phase lock loop comprising:
    a phase/frequency detector for comparing and detecting a reference clock and an output clock to output a first pulse and a second pulse;
    a lock detector coupled to the phase/frequency detector for sampling the second pulse according to the first pulse and for sampling the first pulse according to the second pulse to indicate whether the phase lock loop is locked;
    a charge pump coupled to the phase/frequency detector for converting the first and the second pulse into a control voltage; and
    a voltage controlled oscillator coupled to the charge pump for generating the output clock according to the control voltage.

7. The phase lock loop according to claim 6, wherein, the lock detector comprises:
    a first pulse width extender and a second pulse width extender for performing pulse extension on the first pulse and the second pulse to generate a third pulse and a fourth pulse, respectively;
    a first delay circuit and a second delay circuit for delaying the third pulse and the fourth pulse into a first sampling clock and a second sampling clock, respectively; and
    a cross-sampling circuit for sampling the third pulse according to the second sampling clock and for sampling the fourth pulse according to the first sampling clock, the lock detector indicating whether the phase lock loop is in a lock state according to a cross-sampling result from the cross-sampling circuit.

8. The phase lock loop according to claim 7, wherein pulse widths of the third pulse and the fourth pulse are known.

9. The phase lock loop according to claim 7, wherein:
    the first delay circuit delays the third pulse by a half of the pulse width of the third pulse; and
    the second delay circuit delays the fourth pulse by a half of the pulse width of the fourth pulse.

10. The phase lock loop according to claim 7, wherein, the cross-sampling circuit comprises:
    a first flip-flop circuit for sampling the third pulse according to the second sampling clock;
    a second flip-flop circuit for sampling the fourth pulse according to the first sampling clock; and
    a logic circuit for receiving outputs from the first flip-flop circuit and the second flip-flop circuit, wherein an output of the logic circuit indicates whether the phase lock loop is in the lock state.

11. The phase lock loop according to claim 7, wherein, when a phase difference between the first pulse and the second pulse is smaller than a half of the pulse width of the third pulse or smaller than a half of the pulse width of the fourth pulse, the cross-sampling circuit indicates that the phase lock loop is in the lock state.

12. A lock detecting method for detecting whether an output clock is locked to a reference clock, comprising:
- comparing and detecting the reference clock and the output clock to output a first pulse and a second pulse;
- extending a pulse width of the first pulse to generate a third pulse;
- extending a pulse width of the second pulse to generate a fourth pulse;
- delaying the third pulse into a first sampling clock;
- delaying the fourth pulse into a second sampling clock; and
- sampling the third pulse according to the second sampling clock and sampling the fourth pulse according to the first sampling clock to indicate whether the output clock is locked to the reference clock.

13. The method according to claim 12, wherein, the pulse widths of the third pulse and the fourth pulse are known.

14. The method according to claim 13, further comprising:
- delaying the third pulse into the first sampling clock according to a half of the pulse width of the third pulse; and
- delaying the fourth pulse into the second sampling clock according to a half of the pulse width of the fourth pulse.

15. The method according to claim 13, wherein, when a phase difference between the first pulse and the second pulse is smaller than a half of the pulse width of the third pulse or smaller than a half of the pulse width of the fourth pulse, this indicates that the output clock is locked to the reference clock.

* * * * *